United States Patent [19]

White et al.

[11] 4,191,975
[45] Mar. 4, 1980

[54] DIGITAL PHASE SYNCHRONIZING SYSTEM

[75] Inventors: Hugh E. White, Pennington; Robert J. Petri, Princeton, both of N.J.

[73] Assignee: RCA Corporation, New York, N.Y.

[21] Appl. No.: 935,960

[22] Filed: Aug. 23, 1978

[51] Int. Cl.² ............................................. H04N 1/36
[52] U.S. Cl. .................................. 358/264; 358/267; 318/85; 178/69.1
[58] Field of Search ............... 178/69.1; 358/264, 265, 358/267, 35; 318/85, 314, 756, 809

[56] References Cited

U.S. PATENT DOCUMENTS

| | | | |
|---|---|---|---|
| 3,622,703 | 11/1971 | Ricketts | 358/267 |
| 3,934,182 | 1/1976 | Donohue | 318/85 |
| 3,937,883 | 2/1976 | Tanimoto | 358/267 |
| 3,950,615 | 4/1976 | Murase | 358/264 |

Primary Examiner—Robert L. Richardson
Assistant Examiner—Michael A. Masinick
Attorney, Agent, or Firm—Samuel Cohen; Carl V. Olson

[57] ABSTRACT

A digital phase synchronization system in which a received pulse wave is compared in a phase detector with a local pulse wave obtained by frequency dividing the output of a local oscillator. One output of the phase detector is used to control the subtraction or addition of pulses from the local oscillator until phase synchronization is achieved. Another output of the phase detector is used to control the number of pulses which are subtracted or added. The number of pulses subtracted or added is proportional to the phase difference when the phase difference is greater than a predetermined value, and is limited to one or a few pulses when the phase difference is below the predetermined value.

6 Claims, 1 Drawing Figure

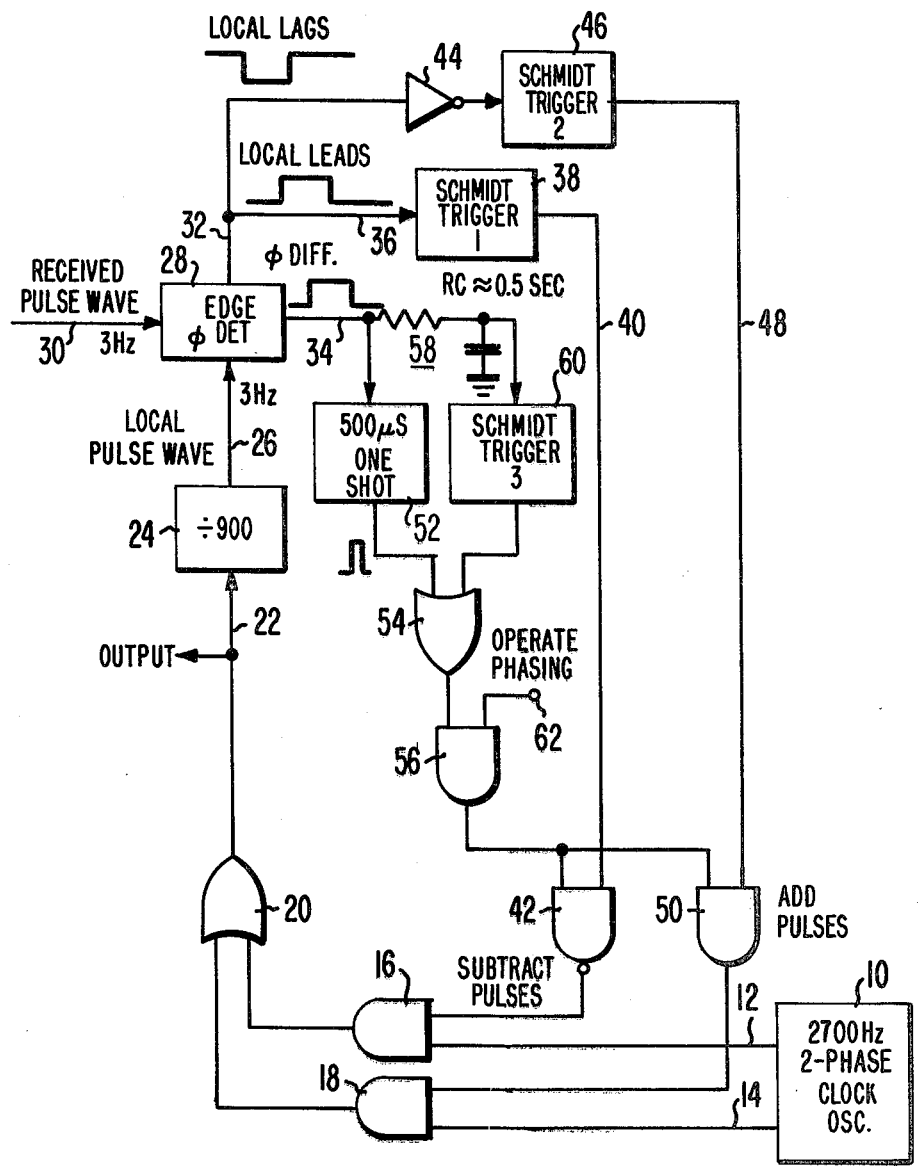

DIGITAL PHASE SYNCHRONIZING SYSTEM

The invention relates to systems for phasing a local pulse wave with a received pulse wave. The invention is useful, for example, in facsimile systems for rapidly synchronizing the phase of rotation of a drum at a receiving terminal with a received facsimile signal.

According to an example of the invention, a received pulse wave is compared in a phase detector with a local pulse wave obtained by frequency dividing the output of a local oscillator. The output of the phase detector is used to subtract or add pulses from the local oscillator until phase synchronization is achieved. The number of pulses subtracted or added is proportional to the phase difference when the phase difference is greater than a predetermined value, and is limited to one or a few pulses when the phase difference is below the predetermined value.

The sole FIGURE of the drawing is a schematic diagram of a pulse wave phasing system constructed according to the teachings of the invention.

Referring in greater detail to the drawing, the system includes a 2700 Hz, two-phase local oscillator or clock 10 having outputs 12 and 14 for pulse waves displaced in phase by 90°. That is, the pulses on output line 12 occur equidistant between the pulses on output line 14. The local oscillator 10 may be a Model CO-236T 5400 Hz crystal oscillator, made by Vectron Laboratories, coupled to a Type CD4047BE multivibrator with ÷2 frequency divider made by RCA Corporation.

The outputs 12 and 14 of oscillator 10 are applied through respective "and" gates 16 and 18 and through an "or" gate 20 to the input 22 of a divider 24, which, in the example being described, provides one output pulse (at a 3 Hz rate) for every 900 pulses it receives from oscillator 10. The divider 24 may be two connected Type CD4518 BE dual decade counters manufactured by RCA Corporation.

The output 26 of the divider 24 is a local pulse wave which is applied to an input of a phase detector 28 having another input at 30 for a 3 Hz received pulse wave. The phase detector 28 has an output 32 for a signal having a pulse whose width indicates the amount of the phase difference between the local and received pulses, and having a polarity which indicates whether the local pulse leads or lags the received pulse. The phase detector 28 also has a second lock-indicating phase pulse output 34, which consists of a voltage level when the system is in phase synchronism, and consists of pulses of width proportional to the phase difference when the system is not in phase synchronism. The phase detector 28 may be phase comparator II, an edge-controlled digital memory network included in a Type CD4046AE digital integrated circuit manufactured by RCA Corporation.

The output 32 of the phase detector 28 is applied to the input 36 of a Schmidt trigger 38 responsive to a signal having the polarity produced by the phase detector when the local pulse wave leads the received pulse wave in phase. The Schmidt trigger 38 produces an output of corresponding duration applied over line 40 to an inverting "and" gate 42. The output 32 of the phase detector is also applied through an inverter 44 to a second Schmidt trigger 46 responsive, because of inverter 44, to a signal having the polarity produced by the phase detector when the local pulse wave lags the received pulse wave in phase. The trigger 46 produces an output of corresponding duration applied over line 48 to an "and" gate 50.

The phase difference/lock signal on output 34 of the phase detector 28 is applied to a 500 μs one-shot multivibrator 52 having its output coupled through an "or" gate 54, and an "and" gate 56 to "enable" inputs of "and" gates 42 and 50. Gate 56 is enabled by an "operate phasing" signal applied at 62. The phase difference signal at 34 is also applied through an integrating circuit 58 to the input of a third Schmidt trigger 60 having its output similarly coupled through gates 54 and 56 to gates 42 and 50. The integrating circuit 58 may have a resistance-capacitance time constant of 0.5 seconds. The Schmidt trigger 60, as well as Schmidt triggers 38 and 46, may be of the kind included on a Type CD4093BE integrated circuit manufactured by RCA Corporation.

In operation, when the system is operated and phase synchronism is achieved, the 3 Hz local pulse wave applied to the phase detector 28 is exactly in phase with the received 3 Hz pulse wave, the 2700 Hz output on line 12 from clock oscillator 10 is coupled through gates 16 and 20 to divider 24, and there are no signal outputs from the phase detector to cause a reduction or an increase in the number of pulses applied to the divider from the oscillator 10.

On the other hand, if, when operation is initiated, the local pulse wave at 26 leads the received pulse wave in phase, the phase detector 28 produces an output signal at 32 having a duration proportional to the difference in phase, and a polarity indicating the that the local wave leads the received wave. This signal activates Schmidt trigger 38 to produce an output of the same duration over line 40 to "and" gate 42 which, if gate 42 is primed or enabled, causes a disabling of gate 16 and a consequent interruption of the flow of 2700 Hz pulses from oscillator 10 to the divider 24 for a time duration corresponding with the amount the local wave leads the received wave in phase.

The interruption of the flow of 2700 Hz pulses occurs when gate 42 is enabled as the result of the phase difference being in excess of a predetermined value, such as 30°, for example. When the phase difference is greater than the predetermined value, the phase difference signal at 34 applied to the integrator 58 results in a voltage high enough to operate the Schmidt trigger 60, which primes or enables gate 42, which in turn disables gate 16 and interrupts the flow of 2700 Hz pulses to divider 24. On the other hand, when the phase difference is less than the predetermined value, the Schmidt trigger 60 is not operated, but the 500 μs one-shot multivibrator 52 is operated to provide a very narrow 500 μs pulse through gates 54 and 56 to enable gate 42 long enough to pass only one pulse during one 370 μs cycle period of the 2700 Hz wave. Then, only one 2700 Hz pulse per cycle of the 3 Hz pulse wave is interrupted and prevented from reaching the divider 24. The phase correction process then proceeds at a slow rate until perfect phase synchronism is achieved. This prevents noise bursts on the received pulse wave from causing large changes in the phase of the local pulse wave when the phase difference between the local and received pulse waves is small.

If, when operation is initiated, the local pulse wave lags the received pulse wave, the output at 32 from the phase detector 28 has a polarity which, after inversion by inverter 44, activates the Schmidt trigger 46 and causes a signal over line 48 to gate 50. If gate 50 is primed or enabled from 56, the signal from trigger 46 passes through to gate 18 where it enables the flow of additional pulses from output 14 of the oscillator 10 to the divider 24. These additional pulses effectively double the frequency of the pulses reaching divider 24 during the time that an output is provided by Schmidt trigger 46 and gate 50 is enabled by integrator 58 and Schmidt trigger 60. Trigger 60 enables gate 50 so long as the phase difference between the local and received waves exceed the predetermined value. When the phase difference falls below the predetermined value, the 500 μs one-shot 52 permits only one pulse from output 14 of oscillator 10 per cycle of the 3 Hz wave to reach the divider 24. This insures the steady progression toward phase synchronization without erratic perturbations due to noise on the received pulse wave.

The operation described has involved the interruption or addition of a number of pulses proportional to the phase difference between the local and received waves when the difference exceeds a predetermined threshold value, and the interruption or addition of a single pulse when the phase difference is less than the predetermined difference. Alternatively, a few pulses or a small number of pulses may be interrupted or added when the phase difference is less than the predetermined value. The one-shot 52 is designed or selected to provide an output pulse having a duration sufficient to span the time of occurrence of the desired few or small number of pulses from the oscillator 10.

After phase synchronization is achieved, the "operate phasing" signal is removed from the enable input 62 of "and" gate 56 and then the interruption and adding of pulses is no longer possible. The oscillator 10 is sufficiently stable so that its phase remains the same as the phase of the received pulse wave for a period sufficient to accomplish the recording of a sheet of copy on a facsimile machine, for example. Outputs of the phasing system at 22 and 26 ar suitable for use by facsimile or other apparatus (not shown).

What is claimed is:

1. A system for phasing a local pulse wave with a received pulse wave, comprising
   a phase detector having a local pulse wave inut and being receptive to the received pulse wave, and having an output,
   a two-phase clock having two outputs,
   a pulse frequency divider coupled between the outputs of said clock and the local pulse wave input of said phase detector,
   means responsive to the output of the phase detector to interrupt the flow of pulses from one output of the clock to the divider for a period equal to the amount the local pulse wave leads the received pulse wave,
   means responsive to the output of the phase detector to enable the flow of pulses from the other output of the clock to the divider for a period equal to the amount the local pulse wave lags the received pulse wave, and
   means operative when the phase difference between the local and received pulse waves is small to limit the interruption of clock pulses from the one output of the clock, and to limit the enabling of clock pulses from the other output of the clock.

2. A system according to claim 1 in which said means to limit the interruption and enabling of clock pulses comprises means for limiting the interruption and enabling to one clock pulse per cycle of the received pulse wave.

3. A system according to claim 1 wherein said phase detector is an edge phase detector providing an additional output pulse wave having a duty cycle proportional to the phase difference between the local and received pulse waves.

4. A system according to claim 3 wherein the means to limit the interruption and enabling of clock pulses includes means responsive to said additional output pulse wave to produce a narrow pulse wave whenever there is a phase difference, and to produce a continuous signal level when the phase difference exceeds a predetermined threshold valve.

5. A system according to claim 4 wherein said means to produce a narrow pulse wave includes a one-shot multivibrator.

6. A system according to claim 5 wherein said means to produce a continuous signal level includes a time constant circuit and a trigger circuit.

* * * * *